(12) United States Patent  
Tang

(10) Patent No.: US 9,285,394 B2
(45) Date of Patent: Mar. 15, 2016

(54) TESTING APPARATUS AND METHOD

(71) Applicant: Taiwan Semiconductor Manufacturing CO., LTD., Hsinchu (TW)

(72) Inventor: Kai-Yi Tang, New Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 95 days.

(21) Appl. No.: 14/151,057

(22) Filed: Jan. 9, 2014

(65) Prior Publication Data

US 2015/0192610 A1  Jul. 9, 2015

(51) Int. Cl.
*G01R 1/04* (2006.01)
*G01R 1/073* (2006.01)

(52) U.S. Cl.
CPC ............ *G01R 1/0491* (2013.01); *G01R 1/0416* (2013.01); *G01R 1/073* (2013.01)

(58) Field of Classification Search
None
See application file for complete search history.

(56) References Cited

U.S. PATENT DOCUMENTS

| | | | | |
|---|---|---|---|---|
| 4,438,397 A * | 3/1984 | Katz | ................. | G01R 1/06722 324/72.5 |
| 4,508,405 A * | 4/1985 | Damon | ................. | H05K 7/1069 324/754.08 |
| 5,017,865 A * | 5/1991 | Oldfield | ............. | G01R 31/2822 324/754.14 |
| 5,225,773 A * | 7/1993 | Richards | ............ | G01R 1/06722 200/61.76 |
| 5,596,282 A * | 1/1997 | Giddings | ............ | G01R 1/0433 324/750.22 |
| 5,744,977 A * | 4/1998 | Cuautla | ............. | G01R 1/06722 324/755.05 |
| 6,043,667 A * | 3/2000 | Cadwallader | ...... | G01R 31/2887 324/750.19 |
| 6,069,483 A * | 5/2000 | Maxwell | ................. | G01R 1/04 279/126 |
| 6,227,703 B1 * | 5/2001 | DiMatteo | ............. | G01D 11/245 374/208 |
| 6,304,073 B1 * | 10/2001 | Saito | ...................... | G01R 31/01 324/757.04 |
| 6,377,059 B2 * | 4/2002 | Vinther | ............... | G01R 1/06722 324/72.5 |
| 6,626,682 B2 * | 9/2003 | Sausen | ................. | G01R 1/0483 324/750.19 |
| 6,677,772 B1 * | 1/2004 | Faull | .................. | G01R 1/06722 324/755.05 |
| 6,720,789 B1 * | 4/2004 | Audette | ............. | G01R 31/2886 324/750.16 |
| 6,821,131 B2 * | 11/2004 | Suzuki | ............... | H01R 13/2421 439/700 |
| 6,848,721 B2 * | 2/2005 | Brans | .................... | B60T 17/043 285/121.1 |
| 7,151,368 B2 * | 12/2006 | Joung | ................... | G01R 1/0408 324/757.01 |
| 7,154,286 B1 * | 12/2006 | Marx | .................. | H01R 13/2421 324/755.05 |
| 7,315,176 B2 * | 1/2008 | Nelson | ............... | G01R 1/06722 324/755.05 |
| 7,362,117 B2 * | 4/2008 | Saito | ..................... | G01R 1/0458 324/750.09 |
| 7,400,161 B2 * | 7/2008 | Saito | ................... | G01R 31/2893 324/757.04 |
| 7,545,159 B2 * | 6/2009 | Winter | ............... | G01R 1/06733 324/755.05 |
| 7,570,069 B2 * | 8/2009 | Cram | ................. | G01R 1/06722 324/755.05 |
| 7,642,769 B2 * | 1/2010 | Osakabe | ............. | G01R 31/2893 257/48 |
| 7,724,006 B2 * | 5/2010 | Kasukabe | .......... | G01R 1/06727 324/754.07 |
| 7,839,139 B2 * | 11/2010 | Saito | ................... | G01R 31/2893 324/750.3 |
| 7,852,094 B2 * | 12/2010 | Chraft | ............... | G01R 31/31929 324/754.01 |
| 2012/0112777 A1 * | 5/2012 | Aizawa | ............. | G01R 31/2893 324/750.08 |

* cited by examiner

*Primary Examiner* — Jermele M Hollington
*Assistant Examiner* — Suresh K Rajaputra

(57) ABSTRACT

A test apparatus includes a DUT block, at least one probe and at least one variable-length pusher. The DUT block is used for allowing the DUT to be disposed thereon. The probe is located on the DUT block. The variable-length pusher is located above the probe. The actuator is used for moving the variable-length pusher to push against the DUT to force the DUT to be in electrical contact with the probe.

20 Claims, 7 Drawing Sheets

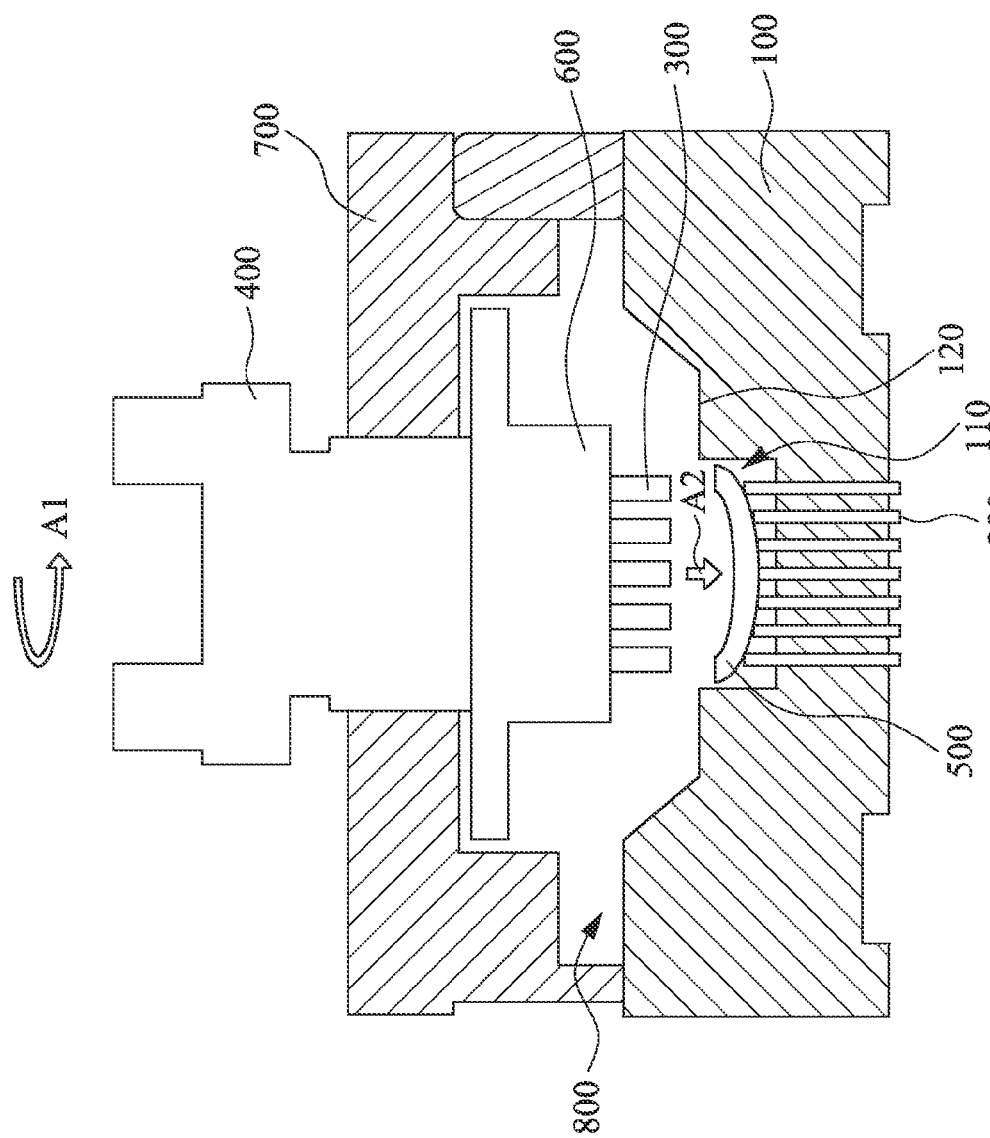

TESTING APPARATUS AND METHOD

BACKGROUND

A Semiconductor device is tested at various stages of processing. Once a semiconductor device has been packaged, a final test (FT) is performed. The FT test of the packaged device may include writing data to and reading data from the packaged device, such as an integrated circuit (IC). The FT test is performed to identify if the integrated circuit was damaged during the packaging process.

BRIEF DESCRIPTION OF THE DRAWINGS

FIGS. 1A to 1C are cross-sectional views of a testing apparatus at different steps of the testing process in accordance with various embodiments of the present disclosure;

DETAILED DESCRIPTION

Figure 1B:
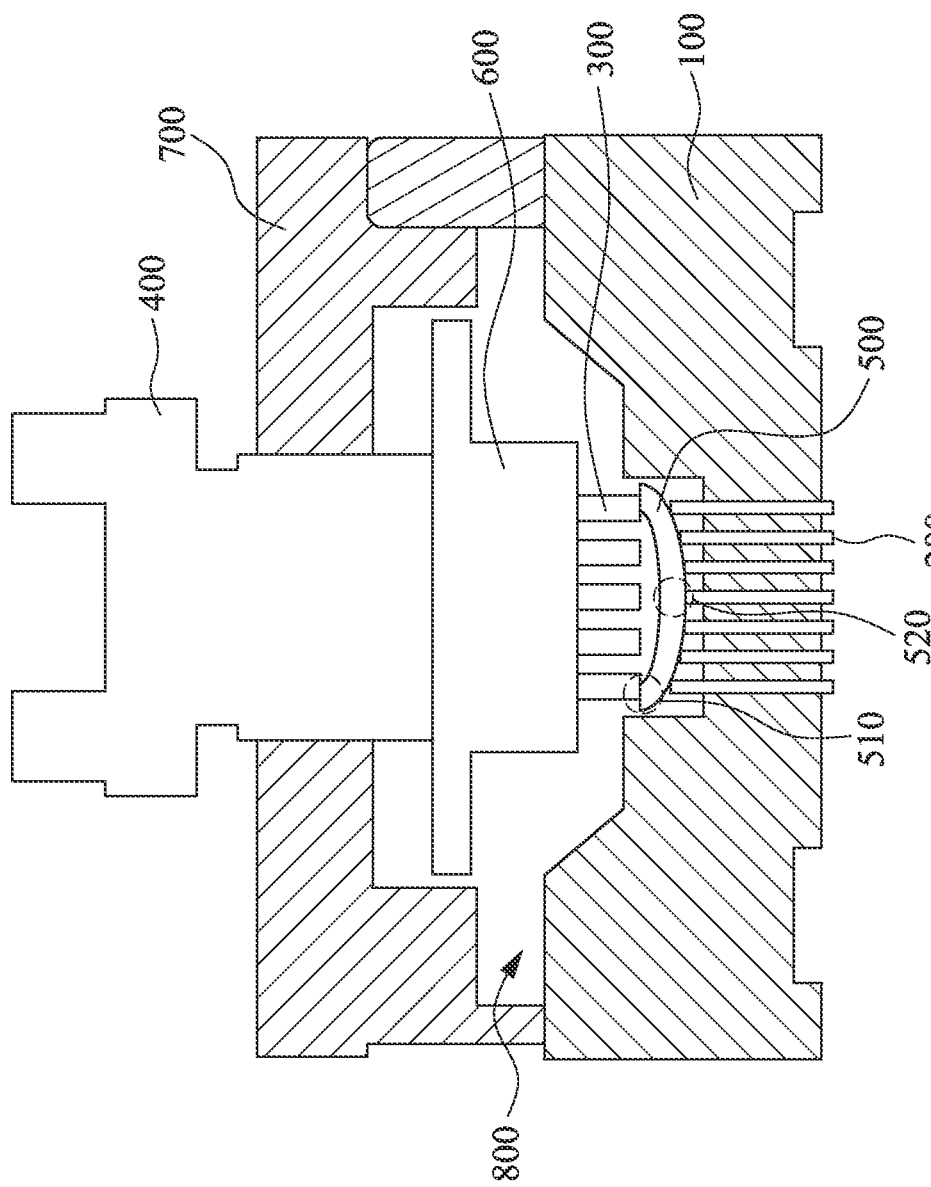

Reference will now be made in detail to the present embodiments of the disclosure, examples of which are illustrated in the accompanying drawings. Wherever possible, the same reference numbers are used in the drawings and the description to refer to the same or like parts.

Figure 1C:
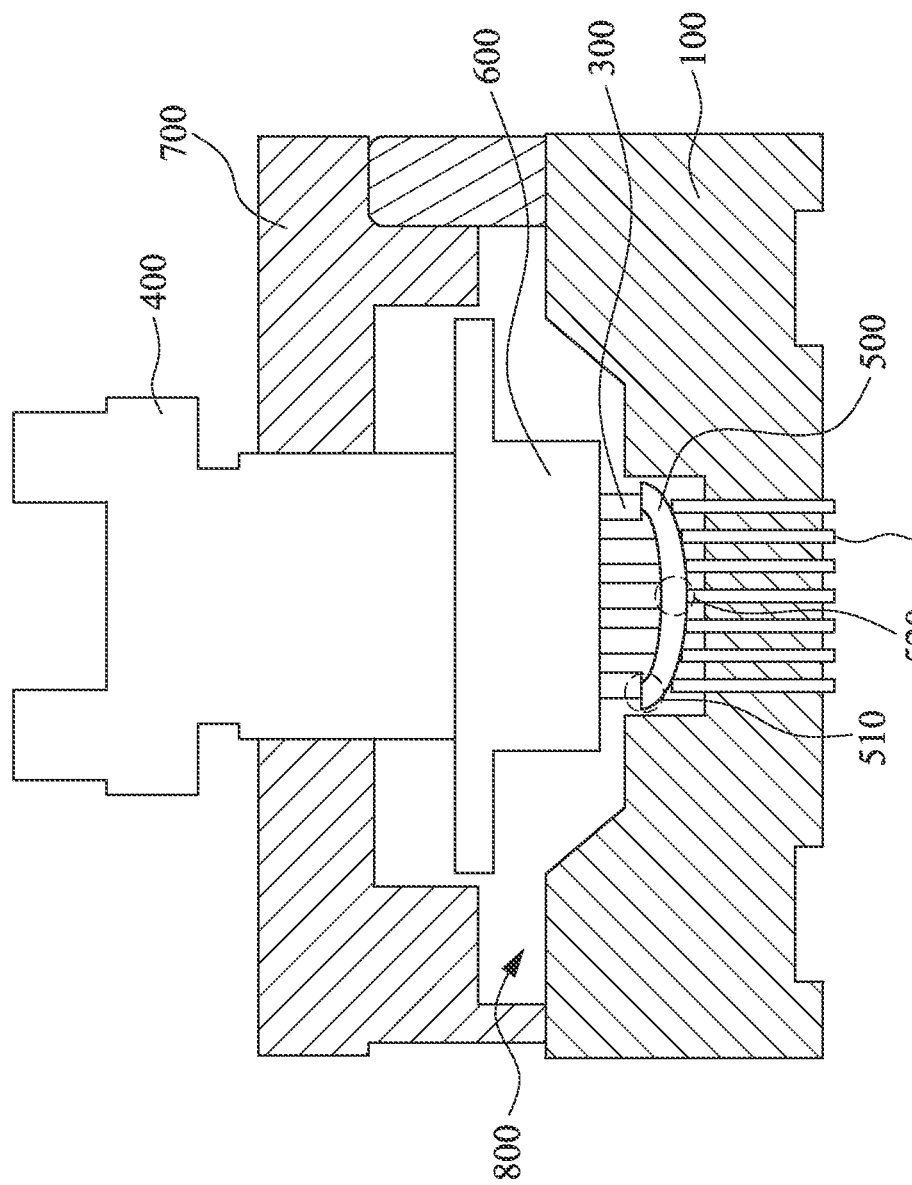

Final test of a packaged device, such as an IC, can be performed by a probing machine. In particular, the device under test (DUT) can be placed on the probing machine for allowing the probes to be in electrical contact with contact pad (or metal bump, solder balls, etc.) of the DUT, so that the test can be performed. FIGS. 1A to 1C are cross-sectional views of an apparatus for testing the DUT at different steps of the test process in accordance with various embodiments of the present disclosure. As shown in FIG. 1A, the apparatus includes a DUT block 100, at least one probe 200, at least one variable-length pusher 300 and an actuator 400. The DUT block 100 is used for allowing the DUT 500 to be disposed thereon. The probe 200 is located on the DUT block 100. The variable-length pusher 300 is located above the probe 200. The DUT 500 is disposed on the probe 200. The actuator 400 is used for moving the variable-length pusher 300 to push against the DUT 500 to force the DUT 500 to be in electrical contact with the probe 200.

Because the variable-length pusher 300 has variable length, the length may vary to make the variable-length pusher 300 to fit the DUT 500 when the DUT 500 is warped. For example, as shown in FIG. 1A, the DUT 500 is disposed on the probes 200, and the actuator 400 may be controlled to move the variable-length pushers 300 toward the DUT 500. For example, the actuator 400 may include a control knob that is rotatable. When the control knob is rotated along the direction A1, the variable-length pushers 300 may move along the direction A2 toward the DUT 500. Then, as shown in FIG. 1B, at least one of the variable-length pushers 300 is in contact with a higher zone 510 of the DUT 500, and a lower zone 520 of the DUT 500 that is lower than the higher zone 510 is spatially separated from the variable-length pushers 300. When the actuator 400 keeps pushing the variable-length pushers 300, as shown in FIG. 1C, the variable-length pusher 300 that is in contact with the higher zone 510 of the DUT 500 can be compressed, and other variable-length pushers 300 can move to be in contact with other zones of the DUT 500, including the lower zone 520 of the DUT 500. As such, the variable-length pushers 300 can be individually compressed to fit the DUT 500, and they can exert zonal forces to different zones of the DUT 500 even if the DUT 500 is warped in various embodiments, which allows the probes 200 to be respectively in electrical contact with zones of the DUT 500 that are at different height.

In various embodiments, when the DUT 500 includes the higher zone 510 that is higher than the lower zone 520, the higher zone 510 is pushed by one of the variable-length pushers 300 before the lower zone 520 is pushed by another of the variable-length pushers 300. Therefore, the reduced length of the variable-length pusher 300 pushing against the higher zone 510 is greater than the reduced length of the variable-length pusher 300 pushing against the lower zone 520.

In various embodiments, as shown in FIG. 1A, a pusher body 600 is included to be coupled to the actuator 400, and the variable-length pushers 300 are disposed on the pusher body 600. The actuator 400 can move the pusher body 600 downwardly, and the variable-length pushers 300 can move downwardly along with the pusher body 600, so as to push against the DUT 500. In various embodiments, the DUT block 100 has a DUT cavity 110 for allowing the DUT 500 to be disposed therein. The probes 200 are in the DUT cavity 110 for probing the DUT 500 in the DUT cavity 110. In various embodiments, the DUT block 100 has a top surface 120. The DUT cavity 110 extends inwardly from the top surface 120. The projection of the pusher body 600 on the top surface 120 is at least partially out of the DUT cavity 110. As such, the top surface 120 of the DUT block 100 can restrain the pusher body 600 from moving into the DUT cavity 110, which controls the maximal reduced length of the variable-length pushers 300. For example, when the pusher body 600 moves downwardly to a particular height, it may be in contact with the top surface 120 of the DUT block 100 and stop moving, so as to stop further compressing the compressed variable-length pushers 300.

In various embodiments, as shown in FIG. 1A, a cover 700 is included to cover the DUT block 100. The cover 700 and the DUT block 100 define an accommodating space 800 therebetween. The variable-length pushers 300 are located in the accommodating space 800 to push against the DUT 500 on the DUT block 100. In various embodiments, a portion of the actuator 400, or more specific the manual control knob mechanism, may be located out of the accommodating space 800, so as to allow the manual control.

Figure 2:
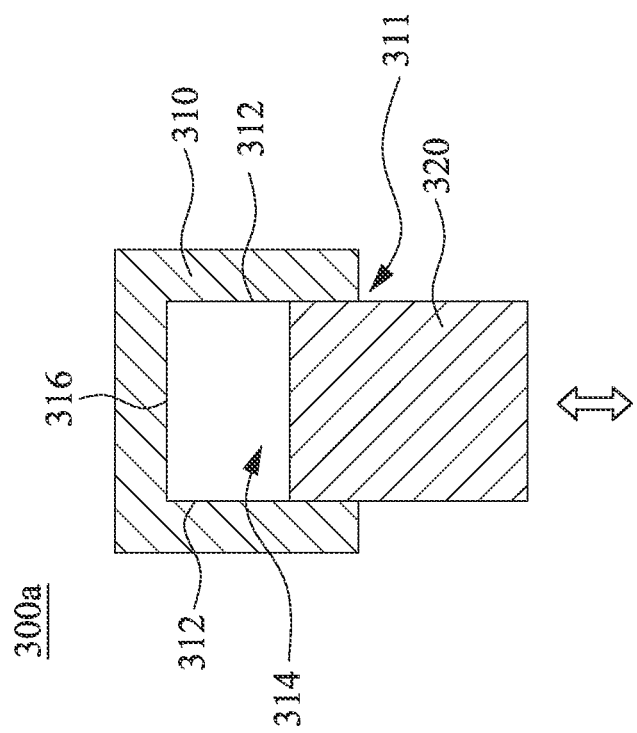
FIG. 2 is a cross-sectional view of the variable-length pusher in accordance with various embodiments of the present disclosure.

FIG. 2 is a cross-sectional view of the variable-length pusher 300a in accordance with various embodiments of the present disclosure. As shown in FIG. 2, the variable-length pusher 300a includes a cylinder 310 and a bar 320. The cylinder 310 is connected to the actuator 400 (See FIG. 1C). The bar 320 is movably disposed in the cylinder 310. In various embodiments, the variable-length pusher 300a is a telescopic pusher. In particular, the bar 320 can be telescopically received in the cylinder 310, or stated differently, the bar 320 can be telescopically movable with respect to the cylinder 310. More particularly, a portion of the bar 320 may be positioned within the cylinder 310, and another portion of the bar 320 may extend through an opening 311 of the cylinder 310. The bar 320 is movable through the opening 311, and thus, the bar 320 and cylinder 310 can be configured for telescopic movement with respect to each other. That is, the bar 320 is free to move into or out of the cylinder 310. Therefore, when the bar 320 encounters an object such as the DUT 500 (See FIG. 1C), it may move into the cylinder 310 due to the force exerted by the DUT 500. In other words, the length of the variable-length pusher 300a may be reduced when it is pushed by the DUT 500 because the bar 320 may move into the cylinder 310 due to the force exerted by the DUT 500.

Because the variable-length pusher 300a may be compressed by a zone of the DUT 500 in contact with the bar 320, the displacements of the bars 320 of the variable-length pushers 300a respectively in contact with zones of the DUT 500 at different heights may be unequal, so as to make the reduced lengths of the variable-length pushers 300a unequal when the DUT 500 is warped.

It is understood that the term "cylinder" used in this context means a hollow object having a space which a bar or a body is movable therein without limiting the shape of the hollow object.

In various embodiments, as shown in FIG. 2, the cylinder 310 allows the bar 320 to perform a linear motion. For example, in various embodiments, the cylinder 310 has at least two opposite inner surfaces 312. The inner surfaces 312 define an inner space 314 therebetween. The bar 320 is at least partially positioned in the inner space 314, and opposite surfaces of the bar 320 is in contact with the inner surfaces 312. In other words, in various embodiments, the bar 320 may be sandwiched between the inner surfaces 312. Therefore, the bar 320 is movable linearly along the inner surfaces 312. As such, when the DUT 500 (See FIG. 1C) exerts a force to the bar 320, the bar 320 may move linearly.

Figure 3:
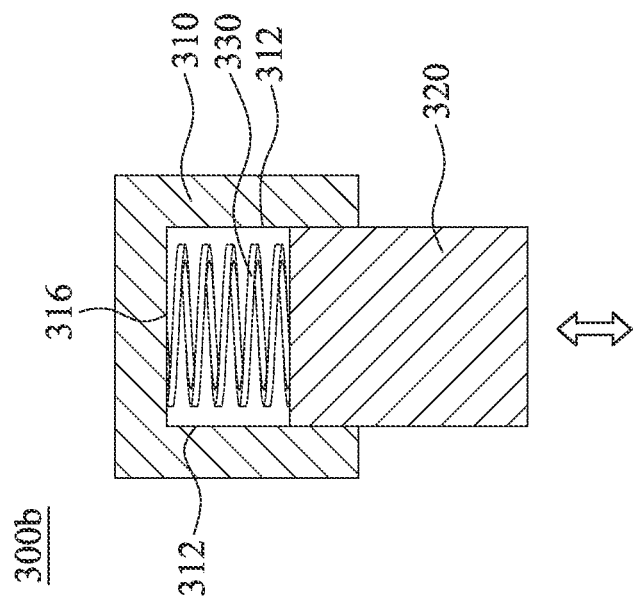
FIG. 3 is a cross-sectional view of the variable-length pusher in accordance with various embodiments of the present disclosure.

FIG. 3 is a cross-sectional view of the variable-length pusher 300b in accordance with various embodiments of the present disclosure. As shown in FIG. 3, the main difference between the variable-length pusher 300b and the variable-length pusher 300a (See FIG. 2) is that the variable-length pusher 300b further includes an elastic member 330. The elastic member 330 connects the cylinder 310 and the bar 320. In other words, the elastic member 330 is disposed between the cylinder 310 and the bar 320. When an object pushes against the bar 320, the elastic member 330 may be compressed. When the object stops pushing against the bar 320, the compressed elastic member 330 may get back to the original length and move the bar 320 to the original position. Accordingly, when the variable-length pusher 300b pushes against the DUT 500 (See FIG. 1C), the elastic member 330 can be compressed by the DUT 500 indirectly, and thus, the length of the variable-length pusher 300b is reduced; when the variable-length pusher 300b moves away from the DUT 500, the elastic member 330 is not compressed, and therefore, the elastic member 330 may get back to the original length, which moves the bar 320 to the original position. As such, the elastic member 330 makes the bar 320 reciprocable with respect to the cylinder 310.

In various embodiments, the cylinder 310 has a top surface 316 connecting the inner surfaces 312. One end of the elastic member 330 is fixed on the top surface 316, and another end of the elastic member 330 is fixed on the bar 320. Through this configuration, when the compressed elastic member 330 tries to get back to the original length, it can push against the bar 320 downwardly.

In various embodiments, the reduced length of the variable-length pusher 300b pushing against the higher zone 510 (See FIG. 1C) is greater than the reduced length of the variable-length pusher 300b pushing against the lower zone 520 (See FIG. 1C). That is, the elastic member 330 of the variable-length pusher 300b pushing against the higher zone 510 is compressed more than that the elastic member 330 of the variable-length pusher 300b pushing against the lower zone 520 is compressed. As such, the reaction force exerted to the higher zone 510 by the compressed elastic member 330 of one variable-length pusher 300b may be greater than the reaction force exerted to the lower zone 520 by the compressed elastic member 330 of another variable-length pusher 300b.

In various embodiments, the elastic member 330 may be, but is not limited to be, an elastomer, a spring, a pogo pin, a Supperbutton™ interposer or a rubber. For example, the elastic member 330 may be a spring, more specific a compression spring, which is designed to operate with a compression load, so as to get shorter and store the elastic potential energy as the load is applied to it.

Figure 4B:
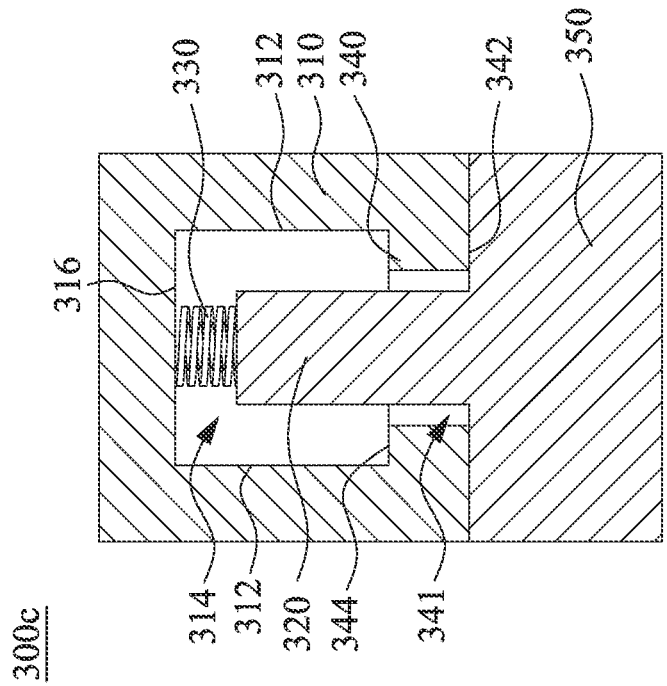
FIGS. 4A and 4B are cross-sectional views of the variable-length pusher in accordance with various embodiments during operation.
Figure 4A:
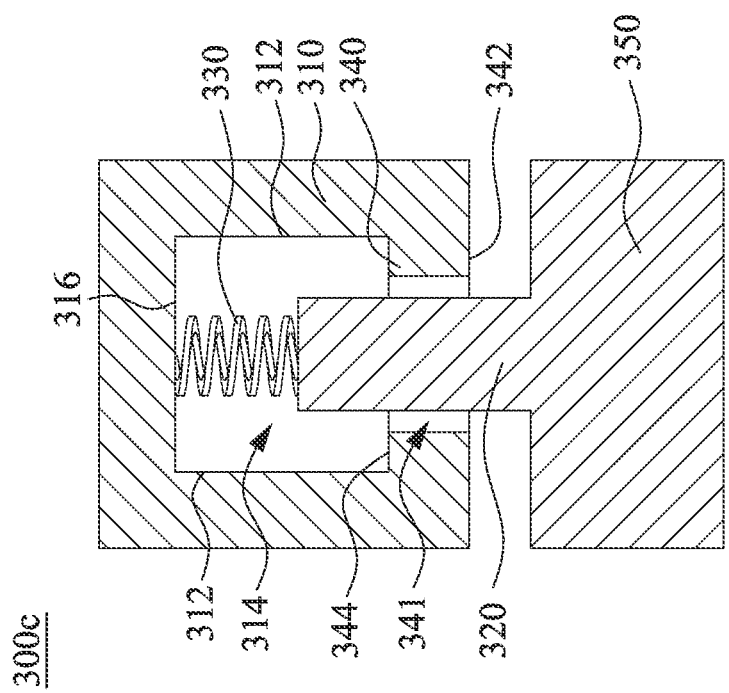

FIGS. 4A and 4B are cross-sectional views of the variable-length pusher 300c in accordance with various embodiments during operation. As shown in FIGS. 4A and 4B, the main difference between the variable-length pusher 300c and the variable-length pusher 300b (See FIG. 3) is that the variable-length pusher 300c further includes a stopper 340 and a flange 350. The stopper 340 is connected to the cylinder 310. The flange 350 is connected to the bar 320. The flange 350 is located out of the cylinder 310. The stopper 340 restrains the flange 350 from being moved over the stopper 340 when the variable-length pusher 300c is retracted or compressed. For example, as shown in FIG. 4B, when the flange 350 moves upwardly to a particular height, it may be in contact with the stopper 340 and stop moving. As such, the maximal displacement of the elastic member 330 that the elastic member 330 is deformed from its equilibrium length can be controlled. The maximal force exerted by the compressed elastic member 330 is proportional to the maximal displacement of the elastic member 330 according to Hooke's law. Therefore, by controlling the maximal displacement of the elastic member 330, the maximal force exerted to the DUT 500 (See FIG. 1C) by the elastic member 330 can be controlled.

In various embodiments, as shown in FIGS. 4A and 4B, the stopper 340 has a through hole 341, an outer surface 342 and an inner surface 344 opposite to the outer surface 342. The inner surface 344 faces toward the inner space 314 inside the cylinder 310. The through hole 341 passes through the inner surface 344 and the outer surface 342, so as to be spatially communicated with the inner space 314 inside the cylinder 310. The through hole 341 allows the bar 320 to move therethrough, and the outer surface 342 of the stopper 340 facing toward the flange 350 blocks the flange 350 from getting into the through hole 341. The distance between the flange 350 and the outer surface 342 when the elastic member 330 reaches an equilibrium state defines the maximal displacement of the elastic member 330, so as to control the maximal force exerted to the DUT 500 (See FIG. 1C) by the elastic member 330.

In various embodiments, the projection of the flange 350 on the outer surface 342 is at least partially out of the through hole 341. As such, the outer surface 342 can block the flange 350 from moving into the through hole 341. In various embodiments, the projection of the flange 350 on the outer surface 342 may cover the whole through hole 341, so as to facilitate the outer surface 342 to block the flange 350 from moving into the through hole 341.

Figure 5B:
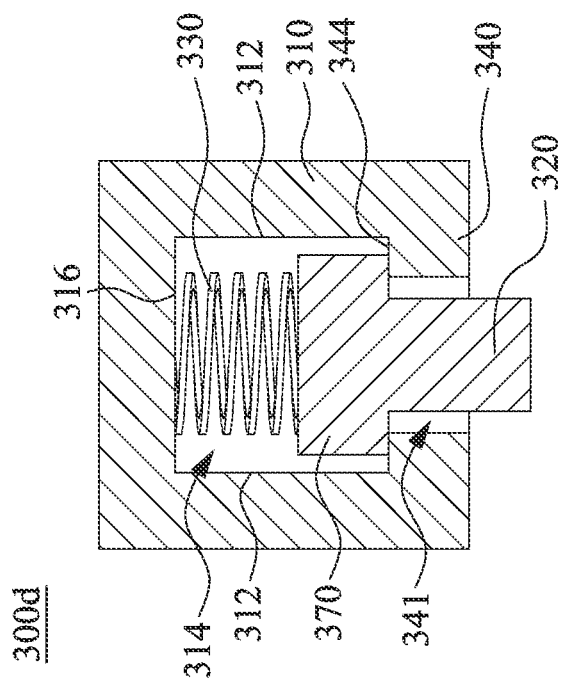
FIGS. 5A and 5B are cross-sectional views of the variable-length pusher in accordance with various embodiments during operation.
Figure 5A:
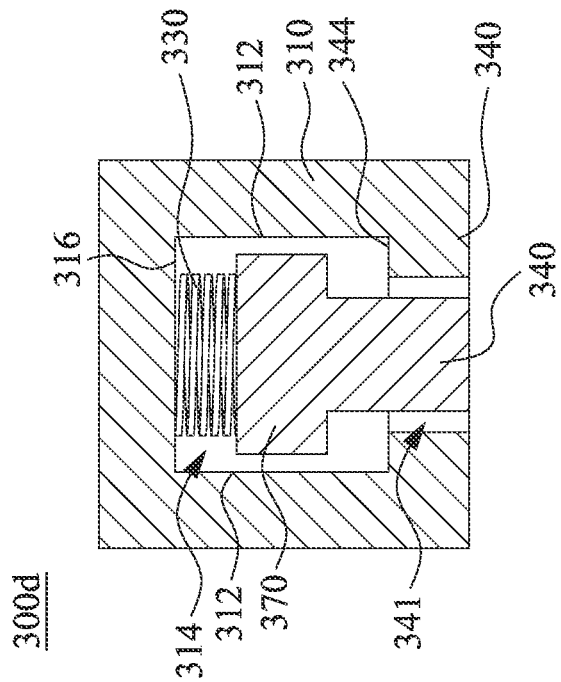

FIGS. 5A and 5B are cross-sectional views of the variable-length pusher 300d in accordance with various embodiments during operation. As shown in FIGS. 5A and 5B, the main difference between the variable-length pusher 300d and the variable-length pusher 300b (See FIG. 3) is that the variable-length pusher 300d further includes a stopper 340 and a flange 370. The stopper 340 is connected to the cylinder 310. The flange 370 is connected to the bar 320 and located in the cylinder 310. In other words, the flange 370 is located in the inner space 314. The stopper 340 restrains the flange 370 from being moved over the stopper 340 when the variable-length pusher 300d is extended. For example, as shown in FIG. 5A, when the bar 320 moves downwardly to a particular height, the flange 370 may be in contact with the stopper 340 and stop moving. As such, the cooperation between the flange 370 and the stopper 340 prevents the bar 320 from moving out of the cylinder 310.

In various embodiments, as shown in FIGS. 5A and 5B, the inner surface 344 of the stopper 340 facing toward the inner space 314 blocks the flange 370 from getting into the through hole 341. For example, in various embodiments, the projection of the flange 370 on the inner surface 344 is at least partially out of the through hole 341. As such, the inner surface 344 can block the flange 370 from moving into the through hole 341. In various embodiments, the projection of the flange 370 on the inner surface 344 may cover the whole through hole 341, so as to facilitate the inner surface 344 to block the flange 370 from moving into the through hole 341.

Figure 6A:
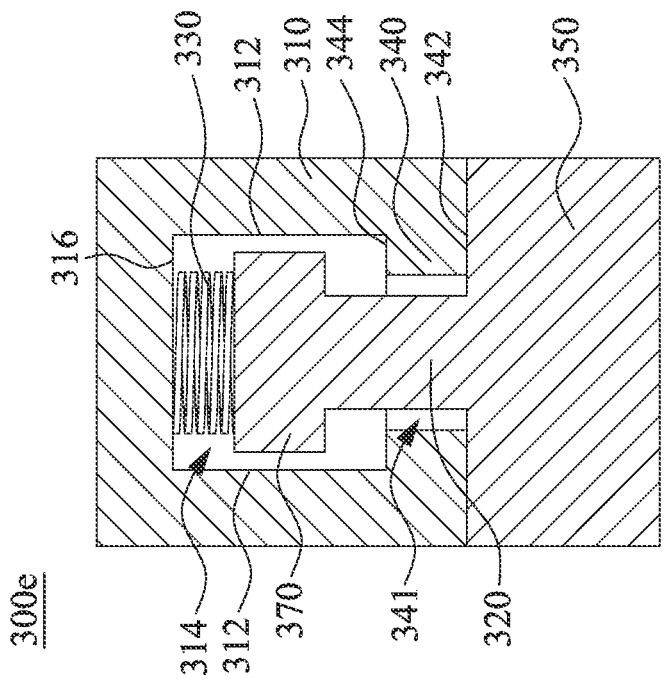
FIGS. 6A and 6B are cross-sectional views of the variable-length pusher in accordance with various embodiments during operation.
Figure 6B:
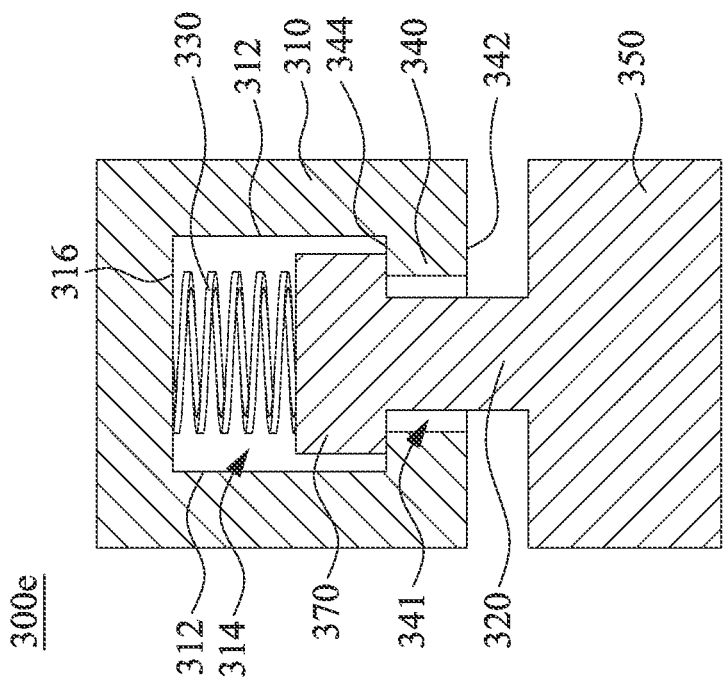

FIGS. 6A and 6B are cross-sectional views of the variable-length pusher 300e in accordance with various embodiments during operation. As shown in FIGS. 6A and 6B, the main difference between the variable-length pusher 300e and the variable-length pusher 300b (See FIG. 3) is that the variable-length pusher 300e further includes a stopper 340 and flanges 350 and 370. The bar 320 and cylinder 310 can perform telescopic movement with respect to each other, and the stopper 340 can restrain the flange 350 from being moved over the stopper 340 when the variable-length pusher 300e is retracted or compressed, and can restrain the flange 370 from being moved over the stopper 340 when the variable-length pusher 300e is extended as well.

For example, in various embodiments, the flange 350 is located out of the cylinder 310, and the flange 370 is located in the cylinder 310, and the bar 320 is connected between the flanges 350 and 370. The bar 320 is movably disposed through the through hole 341. The projection of the flange 350 on the outer surface 342 is at least partially out of the through hole 341. The projection of the flange 370 on the inner surface 344 is at least partially out of the through hole 341 as well. Through this configuration, the bar 320 can be telescopically movable with respect to the cylinder 310, and the movable distance can be controlled by the flanges 350 and 370.

In various embodiments, an apparatus for testing a DUT is disclosed that includes a DUT block, at least one probe, at least one variable-length pusher and an actuator. The DUT block is used for allowing the DUT to be disposed thereon. The probe is located on the DUT block. The variable-length pusher is located above the probe. The actuator is used for moving the variable-length pusher to push against the DUT to force the DUT to be in electrical contact with the probe.

Also disclosed is an apparatus for testing a DUT that includes a DUT block, at least one probe, at least one telescopic pusher and an actuator. The DUT block is used for allowing the DUT to be disposed thereon. The probe is located on the DUT block. The telescopic pusher is located above the probe. The actuator is used for moving the telescopic pusher to push against the DUT to force the DUT to be in electrical contact with the probe.

Also disclosed is a method for testing the DUT. The method includes the steps below. The DUT is disposed on at least one probe. A plurality of variable-length pushers are moved to push against the DUT, such that the variable-length pushers are individually compressed to fit the DUT, and the DUT is forced to be in electrical contact with the probe.

The terms used in this specification generally have their ordinary meanings in the art, within the context of the disclosure, and in the specific context where each term is used. Certain terms that are used to describe the disclosure are discussed below, or elsewhere in the specification, to provide additional guidance to the practitioner regarding the description of the disclosure. For convenience, certain terms may be highlighted, for example using italics and/or quotation marks. The use of highlighting has no influence on the scope and meaning of a term; the scope and meaning of a term is the same, in the same context, whether or not it is highlighted. It will be appreciated that same thing can be said in more than one way. Consequently, alternative language and synonyms may be used for any one or more of the terms discussed herein, nor is any special significance to be placed upon whether or not a term is elaborated or discussed herein. Synonyms for certain terms are provided. A recital of one or more synonyms does not exclude the use of other synonyms. The use of examples anywhere in this specification including examples of any terms discussed herein is illustrative only, and in no way limits the scope and meaning of the disclosure or of any exemplified term. Likewise, the disclosure is not limited to various embodiments given in this specification.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising", or "includes" and/or "including" or "has" and/or "having" when used in this specification, specify the presence of stated features, regions, integers, steps, operations, elements, and/or components, but do not preclude the presence or addition of one or more other features, regions, integers, steps, operations, elements, components, and/or groups thereof.

It will be understood that when an element is referred to as being "on" another element, it can be directly on the other element or intervening elements may be present therebetween. In contrast, when an element is referred to as being "directly on" another element, there are no intervening elements present.

Reference throughout the specification to "various embodiments" means that a particular feature, structure, implementation, or characteristic described in connection with the embodiments is included in at least one embodiment of the present disclosure. Thus, uses of the phrases "in various embodiments" in various places throughout the specification are not necessarily all referring to the same embodiment. Furthermore, the particular features, structures, implementation, or characteristics may be combined in any suitable manner in one or more embodiments.

Furthermore, relative terms, such as "lower" or "bottom" and "upper" or "top", may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper", depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As is understood by one of ordinary skill in the art, the foregoing embodiments of the present disclosure are illustrative of the present disclosure rather than limiting of the present disclosure. It is intended to cover various modifications and similar arrangements included within the spirit and scope of the appended claims, the scope of which should be accorded with the broadest interpretation so as to encompass all such modifications and similar structures.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. An apparatus for testing a device under test (DUT), the apparatus comprising:
   a DUT block for allowing the DUT to be disposed thereon;
   at least one probe located on the DUT block;
   a plurality of variable-length pushers located above the probe, the variable-length pushers being individually compressible by different zones of the DUT to fit a shape of the DUT; and
   an actuator for moving the variable-length pushers to push against the DUT to force the DUT to be in electrical contact with the probe.

2. The apparatus of claim 1, wherein at least one of the variable-length pushers comprises:
   a cylinder connected to the actuator; and
   a bar moveably disposed in the cylinder.

3. The apparatus of claim 2, wherein the at least one of the variable-length pushers further comprises:
   an elastic member connecting the cylinder and the bar.

4. The apparatus of claim 3, wherein the at least one of the variable-length pushers further comprises:
   a stopper connected to the cylinder; and
   a flange connected to the bar and located out of the cylinder, wherein the stopper restrains the flange from being moved over the stopper when the at least one of the variable-length pushers is retracted.

5. The apparatus of claim 3, wherein the at least one of the variable-length pushers further comprises:
   a stopper connected to the cylinder; and
   a flange connected to the bar and located in the cylinder, wherein the stopper restrains the flange from being moved over the stopper when the at least one of the variable-length pushers is extended.

6. The apparatus of claim 1, wherein the DUT block has a DUT cavity for allowing the DUT to be disposed therein, wherein the probe is in the DUT cavity.

7. The apparatus of claim 6, further comprising:
   a pusher body coupled to the actuator, wherein the variable-length pushers are disposed on the pusher body, wherein a projection of the pusher body on a top surface of the DUT block is at least partially out of the DUT cavity.

8. The apparatus of claim 1, further comprising:
   a cover covering the DUT block, wherein the cover and the DUT block defines an accommodating space therebetween, and the variable-length pushers are located in the accommodating space.

9. An apparatus for testing a device under test (DUT), the apparatus comprising:
   a DUT block for allowing the DUT to be disposed thereon;
   at least one probe located on the DUT block;
   a plurality of telescopic pushers located above the probe, the telescopic pushers being individually retractable by different zones of the DUT to fit a shape of the DUT; and
   an actuator for moving the telescopic pushers to push against the DUT to force the DUT to be in electrical contact with the probe.

10. The apparatus of claim 9, wherein at least one of the telescopic pushers comprises:
    a cylinder connected to the actuator; and
    a bar telescopically received in the cylinder.

11. The apparatus of claim 10, wherein the at least one of the telescopic pushers further comprises:
    an elastic member connecting the cylinder and the bar.

12. The apparatus of claim 10, wherein the at least one of the telescopic pushers further comprises:
    a stopper connected to the cylinder; and
    a flange connected to the bar and located out of the cylinder, wherein the stopper restrains the flange from being moved over the stopper when the at least one of the telescopic pushers is retracted.

13. The apparatus of claim 10, wherein the at least one of the telescopic pushers further comprises:
    a stopper connected to the cylinder; and
    a flange connected to the bar and located in the cylinder, wherein the stopper restrains the flange from being moved over the stopper when the at least one of the telescopic pushers is extended.

14. The apparatus of claim 9, wherein the DUT block has a DUT cavity for allowing the DUT to be disposed therein, wherein the probe is in the DUT cavity.

15. The apparatus of claim 14, further comprising:
    a pusher body coupled to the actuator, wherein the telescopic pusher are disposed on the pusher body, wherein a projection of the pusher body on a top surface of the DUT block is at least partially out of the DUT cavity.

16. The apparatus of claim 9, further comprising:
    a cover covering the DUT block, wherein the cover and the DUT block defines an accommodating space therebetween, and the telescopic pushers are located in the accommodating space.

17. A method for testing a device under test (DUT), the method comprising:
    disposing the DUT on at least one probe; and
    moving a plurality of variable-length pushers to push against the DUT, such that the variable-length pushers are individually compressed by different zones of the DUT to fit a shape of the DUT, and the DUT is forced to be in electrical contact with the probe.

18. The method of claim 17, wherein moving the variable-length pushers to push against the DUT comprises:
    pushing against a higher zone of the DUT by one of the variable-length pushers prior to pushing against a lower zone of the DUT by another of the variable-length pushers.

19. The method of claim 18, wherein when the variable-length pushers push against the DUT, an elastic member of one of the variable length pushers is compressed.

20. The method of claim 17, wherein when the variable-length pushers push against the DUT, a force exerted to a higher zone of the DUT is greater than a force exerted to a lower zone of the DUT.

* * * * *